United States Patent
Dupeyrat et al.

(10) Patent No.: US 11,060,920 B2
(45) Date of Patent: Jul. 13, 2021

(54) OPTICALLY TRANSPARENT ELECTROMAGNETIC SHIELD ASSEMBLY

(71) Applicants: SAFRAN ELECTRONICS & DEFENSE, Boulogne-Billancourt (FR); CENTRE NATIONAL DE LA RECHERCHE SCIENTIFIQUE-CNRS, Paris (FR); UNIVERSITE DE RENNES 1, Rennes (FR)

(72) Inventors: Cyril Dupeyrat, Boulogne-Billancourt (FR); Patrice Foutrel, Boulogne-Billancourt (FR); Philippe Besnier, Boulogne-Billancourt (FR); Xavier Castel, Boulogne-Billancourt (FR); Yonathan Corredores, Boulogne-Billancourt (FR)

(73) Assignees: SAFRAN ELECTRONICS & DEFENSE, Boulogne-Billancourt (FR); CENTRE NATIONAL DE LA RECHERCHE SCIENTIFIQUE - CNRS, Paris (FR); UNIVERSITE DE RENNES 1, Rennes (FR)

( * ) Notice: Subject to any disclaimer, the term of this patent is extended or adjusted under 35 U.S.C. 154(b) by 59 days.

(21) Appl. No.: 16/615,265

(22) PCT Filed: May 15, 2018

(86) PCT No.: PCT/EP2018/062529
§ 371 (c)(1),
(2) Date: Nov. 20, 2019

(87) PCT Pub. No.: WO2018/215243
PCT Pub. Date: Nov. 29, 2018

(65) Prior Publication Data
US 2020/0173859 A1 Jun. 4, 2020

(30) Foreign Application Priority Data
May 22, 2017 (FR) .................... 1754537

(51) Int. Cl.
G01J 5/06 (2006.01)
H05K 9/00 (2006.01)

(52) U.S. Cl.
CPC .............. *G01J 5/06* (2013.01); *H05K 9/0081* (2013.01); *G01J 2005/065* (2013.01)

(58) Field of Classification Search
CPC ....... G01T 1/2023; G01T 1/2002; G01T 1/20; G02B 5/26; G02B 5/208
See application file for complete search history.

(56) References Cited

U.S. PATENT DOCUMENTS

2012/0037803 A1* 2/2012 Strickland .............. H01Q 1/425
250/338.1

FOREIGN PATENT DOCUMENTS

WO 2015/199624 A1 12/2015

OTHER PUBLICATIONS

Sayem et al. "Development of Robust Transparent Conformal Antennas Based on Conductive Mesh-Polymer Composite for Unobtrusive Wearable Applications", IEEE Transactions On Antennas and Propagation, vol. 67, No. 12, Dec. 2019, pp. 7216-7224. (Year: 2019).*
Written Opinion of the International Searching Authority dated Aug. 9, 2018, issued in corresponding International Application No. PCT/EP2018/062529, filed May 15, 2018, 4 pages.
(Continued)

*Primary Examiner* — David P Porta
*Assistant Examiner* — Meenakshi S Sahu
(74) *Attorney, Agent, or Firm* — Christensen O'Connor Johnson Kindness PLLC

(57) ABSTRACT

An optically transparent electromagnetic shield assembly comprising an electrical connection device with variable electrical resistance. The electrical connection device electrically connects a conductive two-dimensional structure, which covers a transparent substrate, to a shell portion which
(Continued)

is electrically conductive. The resistance of the connection device can be adjusted, either initially for a detection system for which the shield assembly is intended or in real time while the shield assembly is in use, according to an RF radiation intensity.

13 Claims, 4 Drawing Sheets

(56) References Cited

OTHER PUBLICATIONS

Preliminary International Report on Patentability dated Nov. 26, 2019, issued in corresponding International Application No. PCT/EP2018/062529, filed May 15, 2018, 1 page.
International Search Report dated Aug. 9, 2018, issued in corresponding International Application No. PCT/EP2018/062529, filed May 15, 2018, 3 pages.
Written Opinion of the International Searching Authority dated Aug. 9, 2018, issued in corresponding International Application No. PCT/EP2018/062529, filed May 15, 2018, 5 pages.
Corredores, Y., et al., "Adjustment of Shielding Effectiveness, Optical Transmission, and Sheet Resistance of Conducting Films Deposited on Glass Substrates," IEEE Transactions on Electromagnetic Compatibility 59(4):1070-1078, Mar. 30, 2017.
Kemtron, "Fenêtre optique à blindage èlectromagnètique," <http://www.kemtron.fr/kemtron/downloads/product/kt-ds-f-fenetre-optique-a-blindage-electomagnetique.pdf> retrieved Nov. 19, 2019, 4 pages.

* cited by examiner

OPTICALLY TRANSPARENT ELECTROMAGNETIC SHIELD ASSEMBLY

The present invention relates to an electromagnetic shielding assembly which is optically transparent.

Many applications use optical sensors, for example sensors sensitive to optical radiation which lie within the infrared domain, although the operation of such sensors can be disturbed by electromagnetic radiation, in particular from the microwave domain. Such microwave radiation can in fact interact with electronic circuits which have to be placed in immediate proximity to the sensors, without being able to be sited remotely in volumes that are tight to the microwave radiation originating from the outside. It is then known practice to dispose, in front of such an optical sensor, a shielding element which is at least partially opaque to a part of the microwave radiation, while being at least partially transparent to the optical radiation. For that, the shielding element comprises at least one two-dimensional structure which is electrically conductive, while being at least partially transparent to the optical radiation.

To obtain an efficient protection against the microwave radiation the conductive two-dimensional structure must also be connected electrically to at least a part of a shell which is also electrically conductive, and which surrounds the sensor(s) to be protected. This part of shell constitutes an electrical potential reference for the conductive two-dimensional structure. It may itself be connected electrically to the electrical ground of a support or of a vehicle on which the optical sensor(s) is (are) installed.

More specifically, an optically transparent electromagnetic shielding assembly as known before the present invention comprises:
- a rigid substrate, which has two opposing faces, which is at least partially transparent between its two faces to at least one electromagnetic radiation which has a frequency f comprised between 0.1 GHz (gigahertz) and 40 GHz, called microwave radiation, and that is also at least partially transparent between its two faces to optical radiation which has a wavelength comprised between 0.1 µm and 15 µm;
- at least one electrically conductive two-dimensional structure, which is disposed on at least one of the faces of the substrate, and which is at least partially transparent to the optical radiation; and
- an electrical connection device, which electrically connects at least one first terminal to at least one second terminal, each first terminal being electrically connected to the conductive two-dimensional structure, and each second terminal being intended to be electrically connected to at least a part of a shell which is electrically conductive.

The transmissions and optical transparencies considered, for the substrate and the conductive two-dimensional structure, relate to the optical radiation which is intended to pass through the substrate provided with the conductive two-dimensional structure.

Furthermore, the shielding efficiency, denoted EB(f) and expressed in decibels (dB), can be defined by $EB(f)=-10 \cdot \log_{10}(T(f))$, in which T(f) is a coefficient of energy transmission of the shielding assembly for the microwave electromagnetic radiation which has a frequency f comprised between 0.1 GHz and 40 GHz, and which is intended to pass through the substrate provided with the conductive two-dimensional structure, between the two faces of the substrate.

Now, different detection systems may require different shielding levels, corresponding to different values of the shielding efficiency for the same frequency f. Hitherto, a different shielding assembly has been designed and produced for each of these detection systems, in which the two-dimensional structure is adapted as a function of the value required for the shielding efficiency. However, such an adaptation limits the series of shielding assemblies which are each manufactured for a different shielding efficiency value, and because of that, the unit price of each shielding assembly cannot be reduced.

Moreover, some complex detection systems comprise, in addition to optical sensors, electromagnetic radiation sensors which are efficient in the microwave band, or in proximity thereto in terms of frequency values. It is then necessary for the same shielding assembly which is used for all the sensors of the complex detection system to achieve a trade-off between a sufficiently high shielding efficiency and a level of transparency to the microwave radiation which allows the operation of the microwave radiation sensor(s). Now, there are conditions in which the microwave radiation which is likely to pass through the shielding assembly varies in very significant extent: between low intensity levels for which the shielding assembly must be sufficiently transparent to this microwave radiation, and very high intensity levels against which the shielding assembly must produce an adequate shielding efficiency. Such a situation occurs in particular for a seeker craft approaching a target which emits a jamming microwave radiation. This jamming microwave radiation then has an intensity which increases as the craft approaches the target, but the target can be detected simultaneously by partly using sensors which are sensitive in the spectral domain of the microwave radiation, in addition to optical sensors. Now, the microwave radiation sensors require the microwave radiation which is used to detect the target to be sufficient, even at long distance. For this reason, the existing shielding assemblies are not well suited for such situations, in which the intensity of the microwave radiation varies strongly during use or during a mission.

From this situation, a first object of the invention consists in providing shielding assemblies which can initially have different shielding efficiencies, suited to distinct uses of each of them, while having reduced unit prices.

A second object of the invention consists in providing shielding assemblies which are suited to uses or missions in which the microwave radiation has an intensity which varies strongly, while a part of this microwave radiation can be useful.

To achieve at least one of these objects, or of others, the present invention proposes a shielding assembly as described previously, but in which the electrical connection device is adapted to produce a variable value for an electrical resistance which is effective between each first terminal and each second terminal. This electrical resistance value is either adjustable by an operator, or automatically variable between at least two levels of intensity of the to microwave radiation. In other words, in the latter case, the electrical resistance has a first value for a first level of intensity of the microwave radiation, and a second value for a second level of intensity of the microwave radiation, the first electrical resistance value being lower than the second electrical resistance value whereas the first level of intensity of the microwave radiation is higher than the second level of intensity of the microwave radiation.

Thus, the invention proposes shielding assemblies which each allow the shielding efficiency to be adjusted in at least one of the following conditions:

either an initial setting which can be performed by an operator, in particular as a function of the detection system for which the shielding assembly is intended, or as a function of the use which is planned for the detection system. The resistance of the electrical connection device of the shielding assembly may then remain constant throughout the life of the shielding assembly. However, the possible setting of the resistance of the electrical connection device, after the production of the shielding assembly, makes it possible to use identical shielding assemblies for detection systems whose specifications are different;

or a variation of the resistance of the electrical connection device which is performed automatically during the use of the detection system, in real time, as a function of the level of intensity of the microwave radiation which is received by the detection system.

A shielding assembly according to the invention can form a porthole or a window suitable for closing an opening of the part of shell, and for being disposed simultaneously in front of an optical input of a sensor which is sensitive to the optical radiation. Possibly, the window- or porthole-forming shielding assembly may be adapted to be disposed also simultaneously in front of an input of a sensor sensitive to part of the microwave radiation, in addition to the optical radiation sensor.

Generally, the electrical connection device which has the variable electrical resistance value between the first and second terminals may be borne by the substrate which is partially transparent to the optical radiation and to the microwave radiation. Such embodiments are particularly advantageous and economical, in particular because they reduce the number of components of the shielding assembly, which are separate or not rigidly linked to one another.

The electrical connection device produces an electrical coupling between the conductive two-dimensional structure and the electrical potential reference, with an electrical resistance value of the coupling which is adjustable.

Preferably, the electrical connection device may be adapted so that the electrical resistance which is effective between the first and second terminals is variable between a first value which is greater than 5 times a resistance value per square of the conductive two-dimensional structure, and a second value which is less than $\frac{1}{5}^{th}$ of the resistance value per square of the conductive two-dimensional structure. Moreover, the resistance value per square of the conductive two-dimensional structure may be comprised between 0.01Ω/□ and 20Ω/□.

Generally, the resistance of the electrical connection device, effective between the first and second terminal, may vary between two values which have a quotient of at least 10 between them, and which are respectively less than and greater than the resistance value per square of the two-dimensional structure.

The conductive two-dimensional structure may comprise at least one out of a layer of a metal, preferably a layer of silver, a layer of a transparent and conductive oxide, preferably a layer of tin-doped indium oxide, and a grating of an electrically conductive material, preferably a grating of a metal material.

In first embodiments of the invention for which the electrical resistance can vary automatically during a use of the shielding assembly, the electrical connection device may comprise:

a microwave radiation detector, suitable for delivering a detection signal representative of an intensity of the microwave radiation which is received by this detector;

an electronic circuit which is connected between the first and second terminals, and which is suitable for producing the variable value of the electrical resistance; and a controller, suitable for modifying the value of the electrical resistance which is produced by the electronic circuit, as a function of the detection signal which is delivered by the microwave radiation detector.

For example, the electronic circuit may comprise several branches which are connected in parallel, and which each have an individual resistance value, at least one of the branches comprising a switch which is controlled by the controller to activate or disable an electrical coupling which is produced by this branch between the two-dimensional structure and the part of shell.

Alternatively, the electronic circuit may comprise at least one electrical component which is resistive to at least one frequency comprised between 0.1 GHz and 40 GHz, and which has a resistance value, effective at the frequency considered, which is variable as a function of a control voltage which is applied to the component. This control voltage is then controlled by the controller so as to modify it as a function of the detection signal which is delivered by the detector. The component with variable resistance for the frequency considered can be a PIN diode, for example, or else a portion of a material with metal-insulator transition which is inserted between two electrodes, and which is in contact therewith.

In second embodiments of the invention for which the resistance of the electrical connection device can also vary automatically during a use of the shielding assembly, the electrical connection device may comprise:

a microwave radiation detector, suitable for delivering a detection signal representative of an intensity of the microwave radiation which is to received by this detector;

a portion of a heat-sensitive material with metal-insulator transition, which is connected electrically between the first and second terminals, and which is suitable for producing the variable value of the electrical resistance as a function of a temperature of this portion of heat-sensitive material;

a thermal regulation means, which is arranged to modify a temperature of the portion of the heat-sensitive material; and a controller, which is suitable for activating the thermal regulation means as a function of the detection signal delivered by the microwave radiation detector.

The heat-sensitive material with metal-insulator transition may comprise an oxide of vanadium, for example $VO_2$ or $V_2O_3$, barium and vanadium sulfide ($BaVS_3$), an oxide of nickel and of praseodymium ($PrNiO_3$), an oxide of nickel and of neodymium ($NdNiO_3$), an oxide of lanthanum and of cobalt ($LaCoO_3$), an oxide of iron ($Fe_3O_4$), nickel sulfide (NiS), an oxide of niobium, in particular $NbO_2$, an oxide of titanium ($TiO_2$ or $Ti_2O_3$), an oxide of nickel and of samarium ($SmNiO_3$), or else a mixture or a solid composition which comprises at least one of these materials. These materials with metal-insulator transition, and others, are known to the person skilled in the art and widely documented in the available literature.

In third embodiments of the invention for which the electrical resistance can again vary automatically, the electrical connection device may comprise a portion of a material with metal-insulator transition which is sensitive to an intensity of the microwave radiation, and which is capable of producing the variable electrical resistance value in response to a variation of the intensity of the microwave radiation, when this portion is exposed to receive this microwave radiation. In this case, the portion of the material with metal-insulator transition which is sensitive to the intensity of the microwave radiation may be borne by the substrate of the shielding assembly. The unit price of the shielding assembly can then be reduced additionally. Possibly, the portion of the material with metal-insulator transition which is sensitive to the intensity of the microwave radiation may constitute at least a part of the conductive two-dimensional structure. Generally for such third embodiments of the invention, the material which is sensitive to the intensity of the microwave radiation may be one of those with metal-insulator transition cited for the second embodiments of the invention. Indeed, generally, a material with metal-insulator transition which is sensitive to temperature variation is also sensitive to an external electrical field, in particular a static electrical field or an electrical field of microwave radiation.

A second aspect of the invention proposes a detection system which comprises:
 an optical sensor, which is sensitive to optical radiation;
 optionally, a microwave radiation sensor, which is sensitive to part of microwave radiation;
 at least a part of an electrically conductive shell, which surrounds the optical sensor, and the microwave radiation sensor if appropriate, and which includes an opening; and
 a shielding assembly which conforms to the first aspect of the invention, this shielding assembly being disposed in front of an optical input of the optical sensor, and optionally also in front of a radiation input of the microwave radiation sensor while closing the opening of the part of shell.

Each first terminal of the electrical connection device of the shielding assembly is then electrically connected to the conductive two-dimensional structure, and each second terminal of the same electrical connection device is simultaneously electrically connected to the part of shell.

Other particular features and advantages of the present invention will become apparent from the following description of nonlimiting embodiments, with reference to the attached drawings, in which.

For clarity sake, the dimensions of the elements which are represented in these figures correspond neither to real dimensions nor to real dimensional ratios. Furthermore, identical references which are indicated in different figures denote identical elements or elements which have identical functions.

Figure 1:
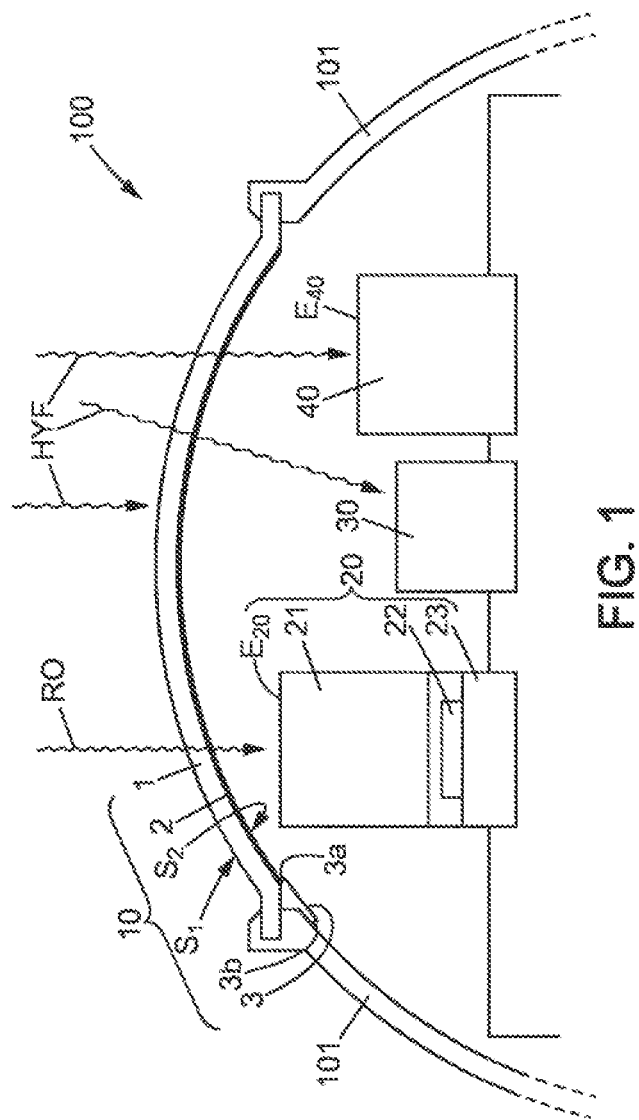
FIG. 1 represents a detection system to which the invention may be applied.

According to FIG. 1, a detection system 100 comprises a part of shell 101, a shielding assembly 10 and at least one optical sensor 20. It may also, optionally, comprise a microwave radiation sensor 40 and a microwave radiation detector 30, which will be described later.

For example, the detection system 100 may have a mobile ball configuration, and be intended to be embedded onboard a self-propelled vehicle. Possibly, the sensors of the detection system 100, including the optical sensor 20 and also possibly the microwave radiation sensor 40, may participate in detecting an external target, to which the self-propelled craft will be directed.

The part of shell 101 is electrically conductive, for example composed of a metal material or of a composite material based on carbon fibers. It constitutes an electrical ground which can be considered as an electrical potential reference. Furthermore, the part of shell 101 surrounds the optical sensor 20, with the microwave radiation sensor 40 and/or the microwave radiation detector 30, if appropriate, by forming a cavity in which this or these sensor or sensors and/or detector are located. Thus, the portion of shell 101, outside of the shielding assembly 10, constitutes an opaque screen to the microwave radiation which originates from the outside.

The optical sensor 20 is sensitive to optical radiation RO in the wavelength band which is comprised between 0.1 μm and 15 μm. It may be an image sensor, which comprises, as is known, a lens 21, an image detector 22, for example of the matrix image detector type, and proximity electronics 23. The proximity electronics 23 are intended in particular to control the operation of the image detector 22, and to transmit the image readout signals which are delivered by this latter, to a remote processing unit (not represented). The operation of the proximity electronics 23 can be disturbed by microwave radiation HYF, in the frequency band comprised between 0.1 GHz and 40 GHz, which might penetrate into the part of shell 101. Indeed, the optical input $E_{20}$ of the optical sensor 20 is necessarily exposed to the outside to collect the optical radiation RO, but this exposure applies also to the microwave radiation HYF, which may comprise an adverse jamming component.

To avoid the effects of such an adverse jamming component, in particular on the proximity electronics 23, the shielding assembly 10 is designed to be opaque to the microwave radiation HYF, while being transparent to the optical radiation RO. However, an excessively high shielding efficiency for the shielding assembly 10 may not be desired. For this reason, the present invention proposes an improvement of the shielding assembly 10 which allows the shielding efficiency thereof to be adjusted, either initially, as part of a factory setting for example, or automatically during a use of the detection system 100. The automatic adjustment of the shielding efficiency of the assembly 10, in real time during its use, can be useful in particular when the detection system 100 comprises the microwave radiation sensor 40, for the operation of which reception of a part of the microwave radiation HYF is nevertheless necessary, without provoking saturation or degradation by over-exposure.

The shielding assembly 10 may form a closing porthole of the part of shell 101, which is disposed in front of the optical input $E_{20}$ of the optical sensor 20, and possibly also in front of the radiation input $E_{40}$ of the microwave radiation sensor 40, and possibly in addition in front of the microwave radiation detector 30.

The shielding assembly 10 comprises a substrate 1 which is transparent to the optical radiation RO and to the microwave radiation HYF, between two opposing faces of this substrate 1 which are denoted $S_1$ and $S_2$. Such a substrate may be based on silicon (Si), on germanium (Ge), on zinc sulfide (ZnS), on silica ($SiO_2$), on aluminum oxide ($Al_2O_3$) or magnesium oxide (MgO). A diameter of the substrate 1 may be between 5 cm (centimeters) and 50 cm, for example.

To produce the electromagnetic shielding efficiency, the substrate 1 bears a two-dimensional structure 2 on at least one of its faces $S_1$ and $S_2$, for example the face $S_2$ in the embodiment of the invention which is represented in FIG. 1. The two-dimensional structure 2 is designed to be transparent to the optical radiation RO, and to be electrically conducive to an extent which is suitable for producing a shielding effect against microwave radiation HYF. For this purpose, the two-dimensional structure 2 may have one of the following configurations, which are cited as nonlimiting examples:

- at least one thin layer of a metal, for example a layer of silver (Ag), which may be inserted between two dielectric layers that are transparent to the optical radiation RO, the purpose of the two dielectric layers being to reduce the reflection of the optical radiation RO relative to the metal layer alone;
- at least one layer of a transparent and conductive oxide, for example a layer of tin-doped indium oxide (ITO), possibly associated with at least one other layer that is dielectric and transparent to the radiation RO, again in order to reduce the reflection of the optical radiation RO relative to the layer of conductive transparent oxide alone;
- a grating of an electrically conductive material, for example a grating of copper (Cu) or of silver (Ag), which is composed of printed ribbons or wires of the conductive material, and with which the substrate 1 is devoid of the electrically conductive material between the ribbons or wires of the grating. Possibly, the conductive material of the grating may be superposed on a bonding material on the substrate 1, and possibly also covered by a protection material, in particular for protection against corrosion, for example an overlayer of titanium (Ti). Generally, the ribbons or wires of such a grating are opaque to the optical radiation RO and the transparency to the optical radiation RO results from a rate of coverage of the substrate 1 by the ribbons or wires of the grating, which is limited. For example, this rate of coverage may be between 10% and 50%, a pitch of the ribbons or wires in the grating may be between 1 μm (micrometer) and 10 mm (millimeters), and the grating may have a square pattern. The grating of an electrically conductive material may be associated with at least one dielectric layer transparent to the radiation RO, also in order to reduce the reflection of the optical radiation RO relative to the substrate 1 alone, but also as protection against the corrosion of the metal grating.

Possibly, the two-dimensional structure 2 may also be comprised of a grating whose ribbons or wires are each optically transparent, by being based on one or more thin layer(s) of a metal which is (are) inserted between dielectric layers, or each based on a transparent and conductive oxide.

Such two-dimensional structures 2 may be produced on the substrate 1 using one of the material deposition processes known to a person skilled in the art, such as cathode sputtering, evaporation, chemical vapor phase deposition, electrolytic deposition, possibly in combination with one or more masking or etching steps.

Such configurations for the two-dimensional structure 2 are known, so there is no need to describe them further here. They may each have a resistance per square which is between $10^{-2}\Omega/\square$ (ohms per square) and $20\Omega/\square$, for example. However, and generally for the invention, the part of shell 101 preferably has a resistance value per square which is lower than that of the two-dimensional structure 2. Thus, the electrical ground or electrical potential reference function is produced to a better extent by the part of shell 101 with respect to the two-dimensional structure 2.

As is also known, the two-dimensional structure 2 must be connected to the part of shell 101 to produce a shielding protection which is effective. An electrical connection device 3 is provided to produce such a connection. It establishes an electrical connection between at least one first terminal 3a which is electrically connected to the two-dimensional structure 2, and at least one second terminal 3b which is electrically connected to the part of shell 101. The connection of each terminal 3a to the two-dimensional structure 2 may be produced by one of the known techniques, such as a surface weld or a pinching with a contact finger which is electrically conductive. Likewise, multiple methods are known for connecting each terminal 3b to the part of shell 101, including plugging-in of a terminal, screwing of a terminal, pressure contact with or without elastic deformation, etc.

However, the shielding efficiency that the two-dimensional structure 2 produces depends on the value of an electrical resistance of the device 3, which is effective between the terminals 3a and 3b. This shielding efficiency varies as a decreasing function of the electrical resistance value of the device 3, for example between a first value which is greater than 5 times the resistance per square of the conductive two-dimensional structure 2, and a second value which is less than $\frac{1}{5}^{th}$ of the resistance per square of the conductive two-dimensional structure 2. For example, the device 3 may be adapted for its electrical resistance between the terminals 3a and 3b to vary between a first value which is less than $2.10^{-3}\Omega$ and a second value which is greater than 100Ω. The first value is preferably lower than the resistance value per square of the two-dimensional structure 2, which is then short-circuited to the part of shell 101, and the second value produces a galvanic insulation between the two-dimensional structure 2 and the part of shell 101.

Figure 2:
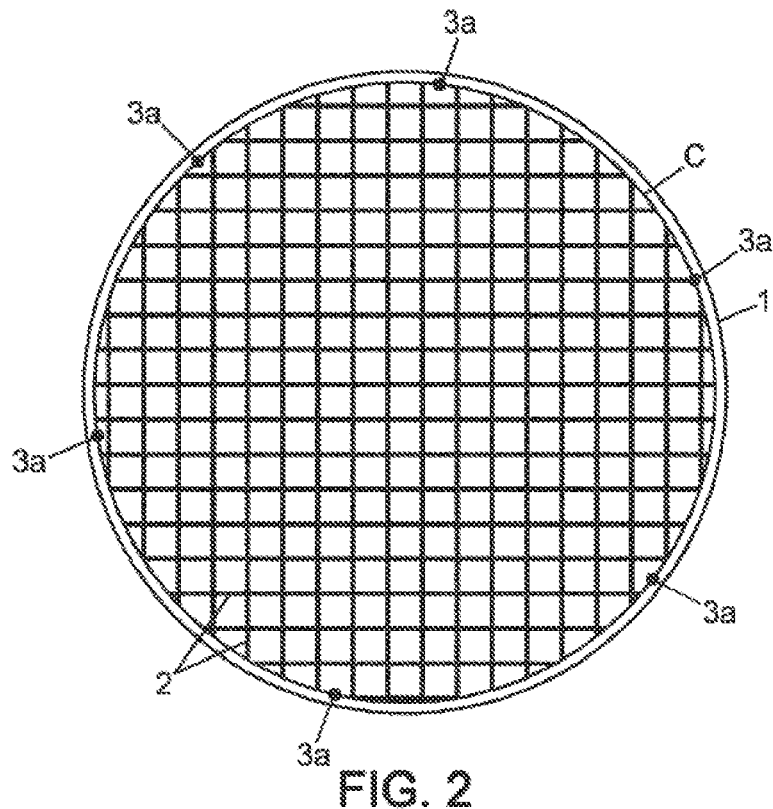
FIG. 2 is a plan view of a porthole that may be composed of the shielding assembly conforming to the invention.

FIG. 2 illustrates a porthole which is composed of a shielding assembly according to the invention, and in which the two-dimensional structure 2 is a metal grating which extends over almost all the useful surface of the substrate 1. This metal grating may be surrounded by a peripheral loop C that is continuous and electrically conductive. This peripheral loop C may be formed on the substrate 1 in the same way as the metal grating of the two-dimensional structure 2, and possibly during the same steps of masking and material deposition procedures. The peripheral loop C is then in electrical contact with the metal grating all around it. Moreover, it may be advantageous for the device 3 to comprise several terminals 3a, for example six terminals 3a, which are distributed along the loop C to reduce differences between electrical resistances which are effective between any point of the two-dimensional structure 2 and each terminal 3b (FIG. 1).

Preferably, the device 3 may have several terminals 3b which are arranged electrically in parallel to one another, and which are intended to be electrically connected at different points of the part of shell 101. Typically, the terminals 3b may be distributed and spaced fairly regularly along the mounting interface of the substrate 1 in the part of shell 101.

Figure 3A:
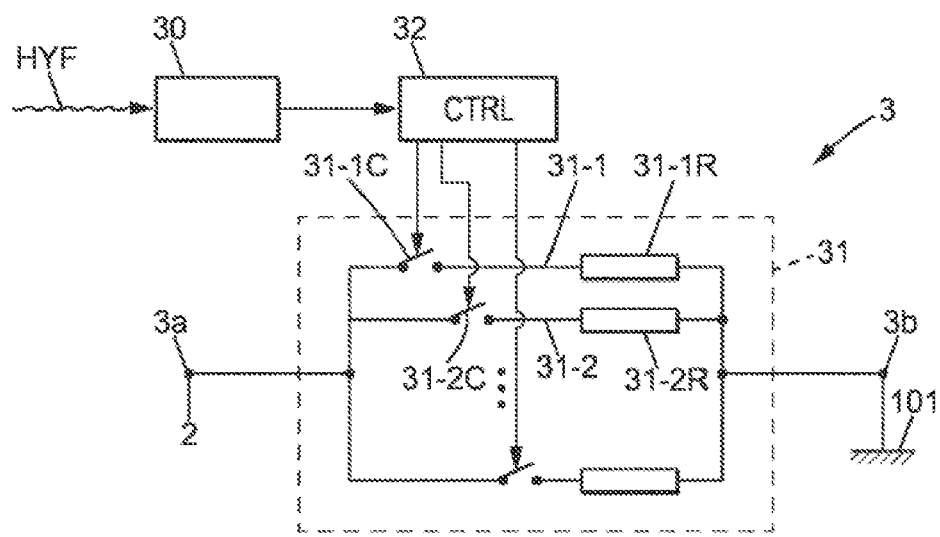
FIGS. 3a-3e illustrate five possible embodiments of the invention.
Figure 3B:
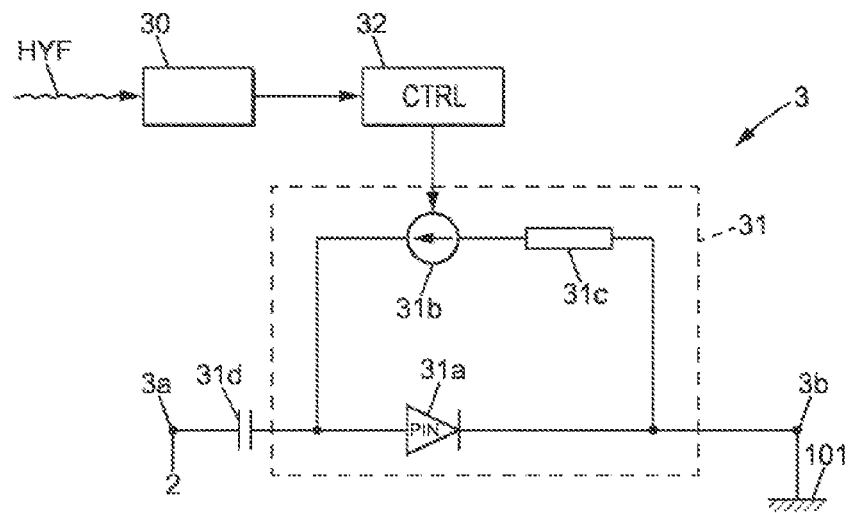

In first embodiments of the electrical connection device 3, which are illustrated by FIGS. 3a and 3b, the variation of the electrical resistance of the device 3 is controlled electrically. The device 3 then comprises the microwave radiation detector 30, an electronic circuit 31, and a controller 32 denoted CTRL.

In the embodiment of FIG. 3a, the electronic circuit 31 comprises several branches 31-1, 31-2, etc. which are connected in parallel between the terminals 3a and 3b. Each branch of the circuit 31 comprises an electrical resistance, referenced 31-1R for the branch 31-1, 31-2R for the branch 31-2, etc., which is connected in series, within that branch, with a switch, referenced 31-1C for the branch 31-1, 31-2C for the branch 31-2, etc. Each switch can be individually opened or closed by the controller 32, by means of a dedicated electrical control. Moreover, the controller 32 receives, from the detector 30, a signal which is representative of the intensity of the microwave radiation HYF. For example, within the controller 32, the open or closed state to be commanded for each level of the signal which is delivered by the detector 30 may be supplied by a pre-stored table. The respective values of the resistances 31-1R, 31-2R, etc. are selected as a function of the values of the shielding efficiency which are desired for several levels of intensity of the microwave radiation HYF. The electrical resistance value which is produced by the device 3 then results from the parallel connection of the resistances 31-1R, 31-2R, etc. of the branches whose switches 31-1C, 31-2C, etc. are closed. Many alternative embodiments are possible for each of the switches 31-1C, 31-2C, etc.: based on a transistor, based on a microelectromechanical system, designated by the acronym MEMS, based on a nano-electromechanical system, designated by the acronym NEMS, etc., all these embodiments being well known to the person skilled in the art.

In the embodiment of FIG. 3b, the electronic circuit 31 comprises a component 31a for which an electrical resistance value which is effective for a microwave current is variable as a function of a control voltage applied to that component 31a. For example, the component 31a may be a PIN diode, commercially available, for example in the form of a discrete component, and where the acronym PIN denotes the type of diode with a positively-doped zone, an intermediate layer with intrinsic conductivity, and a negatively doped zone. The PIN diode 31a is connected between the two terminals 3a and 3b. The circuit 31 then comprises a continuous and variable voltage source 31b, which is connected to the PIN diode 31a to electrically bias this latter. Thus, the electrical resistance value of the PIN diode 31a, which is effective for an alternating current with a frequency of between 0.1 GHz and 40 GHz, called microwave current, can be adjusted by the biased voltage which is produced by the source 31b. For this purpose, the PIN diode 31a and the voltage source 31b are combined in a loop, called biasing loop, which can also comprise a fixed resistance 31c. The controller 32 then controls the biased voltage which is produced by the source 31b as a function of the microwave radiation HYF intensity detection signal, which is delivered by the detector 30. The microwave current which circulates through the PIN diode 31a, between the two terminals 3a and 3b, is generated by the microwave radiation HYF which is incident on the two-dimensional structure 2. Possibly, a decoupling capacitor 31d may also be inserted between the terminal 3a and the biasing loop.

Possibly, the PIN diode 31a may be replaced by a portion of a material with metal-insulator transition as cited elsewhere in this description, when this portion is sensitive to a static electrical field. The portion may be inserted between two electrodes, and in contact therewith, the electrodes being electrically connected to the terminals 3a and 3b. The voltage source 31b then produces a static electrical field in the portion of the material with metal-insulator transition, on which depends the electrical resistance value which is effective between the terminals 3a and 3b.

In the embodiments of the invention which are illustrated by FIGS. 3a and 3b, the use of the detector 30 therefore makes it possible to adjust in real time, during the use of the detection system 100, the electrical resistance of the device 3 as a function of the intensity of the microwave radiation HYF. In the jargon of the person skilled in the art, such an adjustment is called dynamic.

Possibly, when the adjustment of the electrical resistance of the device 3 is performed initially, then its value is retained throughout the use of the shielding assembly 10, the detector 30 can be eliminated from the embodiments of FIGS. 3a and 3b. The controller 32 is then used initially to selectively open or close each of the switches 31-1C, 31-2C, etc., or to initially set the value of the electrical voltage which is produced by the source 31b.

Figure 3C:
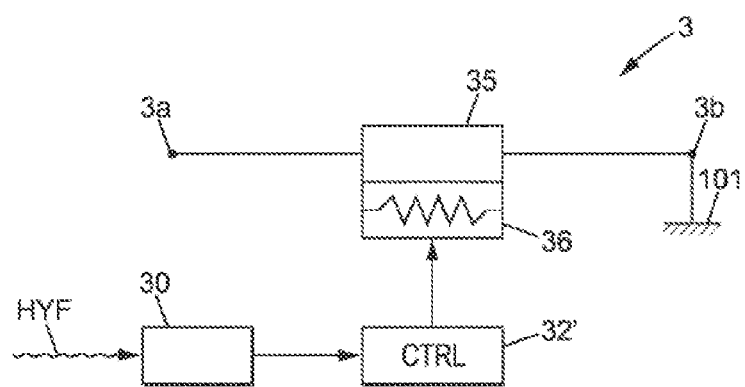

In second embodiments of the electrical connection device 3, which are illustrated by FIG. 3c, the variation of the electrical resistance of the device 3 is thermally controlled. The device 3 then comprises the microwave radiation detector 30, a portion of a heat-sensitive material 35, a thermal regulation means 36, and a controller 32' denoted CTRL. The material of the portion 35 is selected to exhibit a metal-insulator transition, such that its electrical resistivity varies within a very wide extent as a function of the temperature. This may be a portion of vanadium dioxide ($VO_2$). The thermal regulation means 36 is, for example, a heating resistor or a Peltier-effect element, or else a combination of both to operate efficiently in cooling or in heating mode. It is disposed in thermal contact with the portion of heat-sensitive material 35, so as to control the temperature thereof. It is thus possible, via the detector 30 and the controller 32', to control the electrical resistance of the portion 35, and therefore that of the device 3 between the terminals 3a and 3b. For this purpose, the controller 32' controls the operation of the thermal regulation means 36 as a function of the microwave radiation HYF intensity detection signal, which is delivered by the detector 30.

Figure 3D:
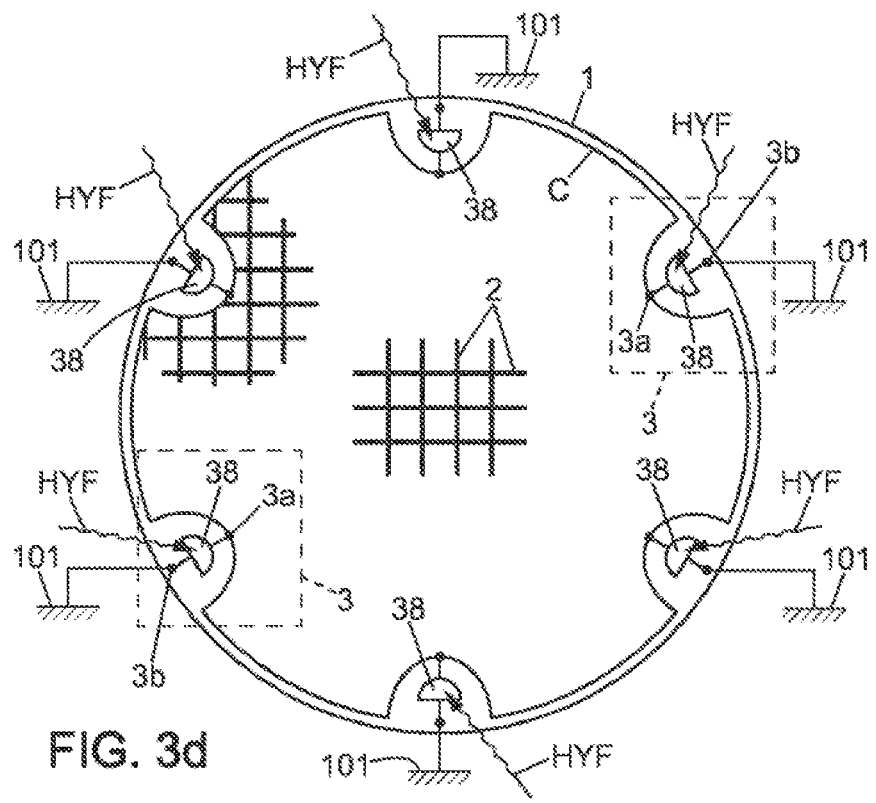
Figure 3E:
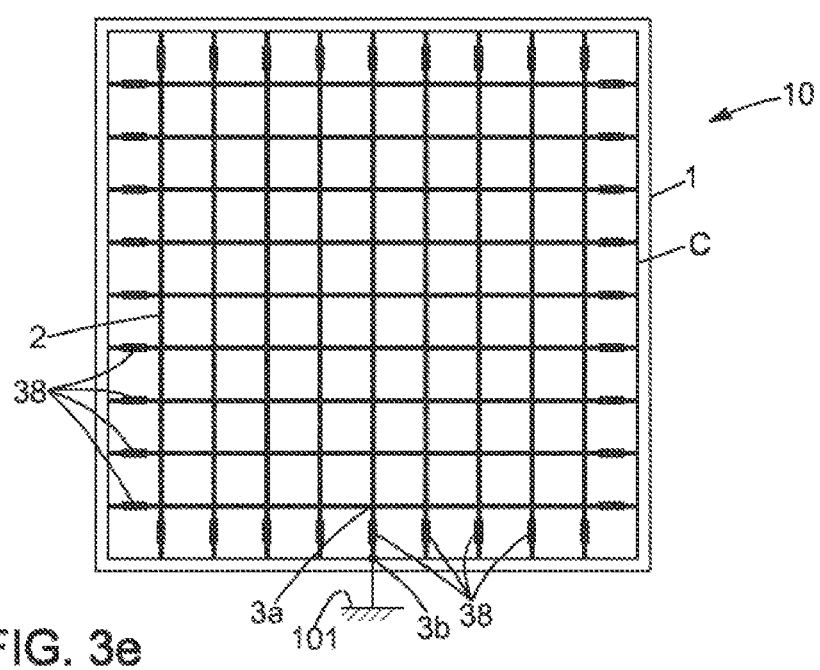

In third embodiments of the electrical connection device 3, which are illustrated by FIGS. 3d and 3e, the variation of the electrical resistance of the device 3 is produced by at least one portion 38 of a material which is directly sensitive to the intensity of the microwave radiation HYF. Each portion 38 is electrically connected between the terminals 3a and 3b, and its material is selected to produce an electrical resistivity which depends on the intensity of the microwave radiation HYF which is received by that portion. The material of each portion 38 may be in particular vanadium dioxide ($VO_2$), for example with a thickness of between 10 nm (nanometers) and 10 µm, measured perpendicular to the face of the substrate 1. Generally, the materials with metal-insulator transition already cited are suitable also for these third embodiments. For such embodiments, each portion 38 must be exposed to the microwave radiation HYF. In accordance with FIG. 3d, the two-dimensional structure 2, for example a metal grating as described above, may be limited on the substrate 1 within the peripheral loop C. The peripheral loop C is electrically conductive, also borne by the substrate 1 and connected electrically to the two-dimensional structure 2. Restricted zones may then be provided on the substrate 1, outside of the peripheral loop C, between this latter and the peripheral edge of the substrate 1. Then, a portion 38 may be borne by the substrate 1 in each of the restricted zones, with a distinct terminal 3b. In each zone, the portion 38 is connected electrically on one side to this terminal 3b, and on the other side to the peripheral loop C. The electrical connections of each portion 38 to one of the terminals 3b and to the peripheral loop C may be formed during the material deposition and etching steps used for the peripheral loop C and the two-dimensional structure 2. Each terminal 3a then consists of the point or segment of electrical connection of one of the portions 38 with the peripheral loop C. One advantage of such third embodiments of the invention is that the electrical connection device 3 with electrical resistance that is variable is borne by the substrate 1 with the two-dimensional structure 2. A cost reduction and ease of assembly within the detection system 100 result therefrom.

Finally, FIG. 3e illustrates a possible variant of the embodiment of FIG. 3d. For reasons of clarity and of simplicity of FIG. 3e, but without limitation as to all possible forms for the substrate 1, the latter is represented with a peripheral edge which is square. The conductive peripheral loop C may then be parallel to this square edge. The conductive two-dimensional structure 2 may again be a metal grating as described above, but which comprises portions 38 of material sensitive to the microwave radiation HYF, in the peripheral segments of this grating which connect it to the peripheral loop C. In this respect, the portions 38 constitute parts of the conductive two-dimensional structure 2. Each portion 38 therefore has a first end which is in electrical contact with the central part of the two-dimensional structure 2, and which constitutes a terminal 3a, and a second end which is in electrical contract with the peripheral loop C, and which constitutes a terminal 3b.

The person skilled in the art will understand that, in the embodiment of FIG. 3e, the central part of the two-dimensional structure 2 may again have any configuration, in particular based on at least one thin metal layer which is inserted between two dielectric layers, or based on at least one layer of conductive transparent oxide as indicated above, this or these layer(s) being possibly continuous or possibly provided with voids.

In variants of the embodiments of FIGS. 3d and 3e, it is possible to replace the portions 38 of the material with metal-insulator transition which is sensitive to the microwave radiation with portions of a material with metal-insulator transition which is sensitive to a static electrical field (DC), or with diodes which are mounted on the substrate 1, while being connected to the terminals 3a and 3b as indicated in these FIGS. 3d and 3e. The diodes which are thus implemented may be of the PIN type described above. For such variants, the voltage source 31b is electrically connected between the central part of the metal grating which constitutes the conductive two-dimensional structure 2 and the peripheral loop C.

Finally, from the embodiment of FIG. 3e, it is also possible to produce the whole conductive two-dimensional structure 2 with the material having metal-insulator transition which is sensitive to the intensity of the microwave radiation HYF. If this material is transparent to the optical radiation RO, it may continuously cover the face of the substrate 1 within the peripheral loop C. Alternatively, if it is opaque to the optical radiation RO, the two-dimensional structure 2 may be a grating of this material with metal-insulator transition which is sensitive to the intensity of the microwave radiation HYF, which is borne by the substrate 1.

It is understood that the present invention can be reproduced by modifying certain secondary aspects thereof relative to the embodiments which have been described in detail hereinabove, but while conserving certain of the advantages cited.

Furthermore, and generally, electrical resistance values for the device 3, to be produced for different levels of the intensity of the microwave radiation HYF, so as to obtain desired values for the shielding efficiency EB, can be determined by experimental or empirical measurements, through parametric digital simulations, or by theoretical models, without requiring an inventive step.

The invention claimed is:

1. An optically transparent electromagnetic shielding assembly, comprising:

a rigid substrate having two opposing faces, said substrate being at least partially transparent between said two faces to at least one electromagnetic radiation which has a frequency comprised between 0.1 GHz and 40 GHz, and that is also at least partially transparent between said two faces to an optical radiation which has a wavelength comprised between 0.1 µm and 15 µm;

at least one electrically conductive two-dimensional structure, which is disposed on at least one of the faces of the substrate and which is at least partially transparent to the optical radiation; and an electrical connection device, which electrically connects at least one first terminal to at least one second terminal, each first terminal being electrically connected to the conductive two-dimensional structure, and each second terminal being intended to be electrically connected to at least a part of an electrically conductive shell, wherein the electrical connection device is adapted to produce a variable value for an electrical resistance which is effective between each first terminal and each second terminal, the electrical resistance value being either adjustable by an operator, or automatically variable as a function of a level of intensity of the microwave radiation so that the electrical resistance has a first value for a first level of intensity of the microwave radiation and a second value for a second level of intensity of the microwave radiation, said first value of the electrical resistance being lower than said second value of the electrical resistance whereas said first level of intensity of the microwave radiation is higher than said second level of intensity of the microwave radiation.

2. The shielding assembly of claim 1, forming a porthole or a window suitable for closing an opening of the part of a shell, and for being disposed simultaneously in front of an optical input of a sensor which is sensitive to the optical radiation.

3. The shielding assembly of claim 1, in which the electrical connection device which has the variable electrical resistance value between the first and second terminals is borne by the substrate that is partially transparent to the optical radiation and to the microwave radiation.

4. The shielding assembly of claim 1, in which the electrical connection device is adapted so that the electrical resistance which is effective between the first and second terminals is variable between a first value which is greater than 5 times a resistance value per square of the conductive two-dimensional structure, and a second value which is less than $\frac{1}{5}^{th}$ of the resistance value per square of said conductive two-dimensional structure.

5. The shielding assembly of claim 1, in which the electrical connection device comprises:

a microwave radiation detector, suitable for delivering a detection signal representative of an intensity of the microwave radiation which is received by the detector;

an electronic circuit which is connected between the first and second terminals, and which is suitable for producing the variable value of the electrical resistance; and a controller configured for modifying the value of the electrical resistance which is produced by the electronic circuit, as a function of the detection signal which is delivered by the microwave radiation detector.

6. The shielding assembly of claim 5, in which the electronic circuit comprises several branches connected in parallel and each having an individual resistance value, at least one of the branches comprising a switch controlled by the controller to activate or disable an electrical coupling which is produced by said branch between the two-dimensional structure and the part of shell.

7. The shielding assembly of claim 5, in which the electronic circuit comprises at least one component which is resistive to at least one frequency comprised between 0.1 GHz and 40 GHZ, a resistance value of said component, effective at said frequency, being variable as a function of a control voltage which is applied to said component, and which is controlled by the controller so as to modify said control voltage as a function of the detection signal delivered by the microwave radiation detector.

8. The shielding assembly of claim 1, in which the electrical connection device comprises:
  a microwave radiation detector, suitable for delivering a detection signal representative of an intensity of the microwave radiation which is received by the detector;
  a portion of a heat-sensitive material with metal-insulator transition, which is connected electrically between the first and second terminals, and which is suitable for producing the variable value of the electrical resistance as a function of a temperature of said portion of heat-sensitive material;
  a thermal regulation means, arranged to modify a temperature of the portion of the heat-sensitive material; and
  a controller configured for activating the thermal regulation means as a function of the detection signal delivered by the microwave radiation detector.

9. The shielding assembly of claim 1, in which the electrical connection device comprises a portion of a material with metal-insulator transition which is sensitive to an intensity of the microwave radiation, and which is capable of producing the variable electrical resistance value in response to a variation of the intensity of the microwave radiation, when said portion is exposed to receive said microwave radiation.

10. The shielding assembly of claim 9, in which the portion of the material with metal-insulator transition which is sensitive to the intensity of the microwave radiation, is borne by the substrate.

11. The shielding assembly of claim 9, in which the portion of the material with metal-insulator transition which is sensitive to the intensity of the microwave radiation, constitutes at least a part of the conductive two-dimensional structure.

12. A detection system comprising:
  an optical sensor, which is sensitive to optical radiation;
  at least a part of an electrically conductive shell, which surrounds the optical sensor and which includes an opening; and
  a shielding assembly which conforms to claim 1, said shielding assembly being disposed in front of an optical input of the optical sensor, while closing the opening of the part of shell,
  each first terminal of the electrical connection device of the shielding assembly being electrically connected to the conductive two-dimensional structure, and each second terminal of said electrical connection device being electrically connected to the part of shell.

13. The detection system of claim 12, further comprising:
  a microwave radiation sensor, which is sensitive to part of the microwave radiation, and
  wherein the shielding assembly is also disposed in front of a radiation input of the microwave radiation sensor, in addition to being disposed in front of the optical input of the optical sensor.

* * * * *